United States Patent [19]

Gemmler

[11] Patent Number: 4,618,568
[45] Date of Patent: Oct. 21, 1986

[54] CHEMICAL METALLIZATION PROCESS WITH RADIATION SENSITIVE CHROMIUM (III) COMPLEX

[75] Inventor: Armin Gemmler, Blaubeuren-Weiler, Fed. Rep. of Germany

[73] Assignee: Licentia Patent-Verwaltungs-GmbH, Frankfurt am Main, Fed. Rep. of Germany

[21] Appl. No.: 661,336

[22] Filed: Oct. 16, 1984

[30] Foreign Application Priority Data

Oct. 18, 1983 [DE] Fed. Rep. of Germany ....... 3337790

[51] Int. Cl.⁴ .................... G03C 5/24; G03C 5/22
[52] U.S. Cl. ..................... 430/417; 430/275; 430/279; 430/311; 430/315; 430/413; 430/495; 427/304; 427/305; 556/62
[58] Field of Search ............... 430/275, 289, 413, 417, 430/495, 311, 315; 427/304, 305; 260/429 J

[56] References Cited

U.S. PATENT DOCUMENTS

| | | | |
|---|---|---|---|
| 3,650,747 | 3/1972 | Colligaris et al. | 430/417 |
| 3,656,952 | 4/1972 | Miller | 427/304 |
| 3,658,534 | 4/1972 | Ishitani et al. | 430/495 |
| 3,671,274 | 6/1972 | Maekawa et al. | 427/305 |
| 3,700,448 | 10/1972 | Hillson et al. | 430/495 |
| 3,719,490 | 3/1973 | Yudelson et al. | 430/495 |
| 3,942,983 | 3/1976 | DiBlas et al. | 427/304 |
| 3,993,802 | 11/1976 | Polichette et al. | 430/413 |
| 4,084,023 | 4/1978 | Dafter | 427/304 |

FOREIGN PATENT DOCUMENTS 473150  6/1975  U.S.S.R. .............. 430/495

OTHER PUBLICATIONS

Sawyer, D. T. et al., *JACS*, vol. 85, p. 2390, 8/1963.
*Research Disclosure*, 12/1973, pp. 94–99.
Jonker, H., et al., *PSR Eng.*, vol. 13, No. 2, 3–4/1969, pp. 38–44.
Goldsmith, S., *Research Disclosure*, 6/1976, pp. 43–44.

*Primary Examiner*—Charles L. Bowers, Jr.
*Attorney, Agent, or Firm*—Spencer & Frank

[57] ABSTRACT

The present invention relates to a chemical metallization process, particularly for the spatially selective metallization of electrically insulating surfaces. This process employs a chemically stable, radiation sensitive sensitizer layer which contains chromium complex compounds and noble metal ions.

10 Claims, No Drawings

CHEMICAL METALLIZATION PROCESS WITH RADIATION SENSITIVE CHROMIUM (III) COMPLEX

BACKGROUND OF THE INVENTION

The present invention relates to a chemical metallization process for metallizing a substrate of the type in which a radiation sensitive sensitizer is applied to the substrate and is then exposed to light, after which the sensitizer is treated with a salt solution of a catalytically effective metal. In particular, the invention relates to a process for manufacturing printed circuits, also called circuit boards, which are used in the electrical industry.

The production of circuit boards for use in electronics is presently still primarily handled according to the so-called subtractive teghnique. The basic material is a plastic substrate material which is coated with copper over its entire surface area and on which conductors are produced by etching away the surplus copper, which may amount to 80% of the total copper employed. Disadvantageous underetching of the metallic conductor paths can be overcome only partially by compensation in the conductor layout and/or by providing protection on the sides of the conductor paths.

To mark the surface pattern to be etched, organic photoresist layers are required and sometimes also additional metalresist coatings. For the last few years, the so-called semiadditive technique has been available. This technique requires only two thirds of the process steps of the subtractive technique and produces less copper waste, but still requires masking and etching processes.

These drawbacks are eliminated in the so-called fully additive technique, particularly if lacquer-free photoadditive process is used, a process which is most economical with respect to the consumption of raw materials and is least damaging to the environment. In a simplified manner, the photoadditive technique can be subdivided into a process scheme which includes the basic material and its pretreatment, image transfer and finally selective activation as well as subsequent metallization.

An important step, for example, in the production of circuit boards, is the transfer of the conductor pattern from a master to the circuit board substrate material. In the photoadditive technique, this requires the application of a sensitizer to the surface of the circuit board, with such sensitizer being activated or deactivated at selected locations by selective exposure to light. Noble metal nuclei can be precipitated on the activated regions from a noble metal salt solution which can then be metallized in a metallization bath operating without external current.

The activated sensitizer plays a key role in the various photoadditive processes. For example, DE-AS [Federal Republic of Germany Published Application] No. 1,917,474 discloses, inter alia, a sensitizer containing a tin(II) salt. This tin(II) salt is converted by UV light into tin(IV) which then is no longer able to reduce, for example, palladium chloride in aqueous solution, to palladium nuclei.

The drawback of these sensitizers containing tin(II) is their oxidation sensitivity with respect to oxygen in the air. For example, solutions of tin(II) salts are oxidized to tin(IV) salts in air and these hydrolize in aqueous solutions and result in multinucleus tin oxide hydrates which are deposited at the bottom of the vessel as a gel-like colorless precipitate. The tin(II) content of such a solution thus continuously decreases over time. Without adapting the exposure times and/or keeping constant the tin(II) concentration, underexposures and/or reflections between an exposure mask and base material would have an annoying influence, particularly in the assembly of the thinnest finest conductors. Titanium and lead salts behave in a manner similar to the tin salts.

DE-AS No. 1,917,474 additionally mentions an iron-(III) oxalate photopromoter whose reaction under the influence of actinic radiation is stated to take place as follows:

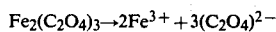

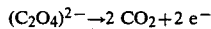

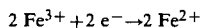

The resulting iron with oxidation number +2 is then able to precipitate, for example, palladium seeds, or nuclei, from a palladium chloride solution according to the following formula:

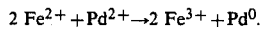

One drawback of this photopromoter is the presence of iron with oxidation number +2 with which the iron-(III) salts are in equilibrium. The iron(II) present without exposure to light effects nucleus formation in the sense of the above equation and may be the cause of an unintended metal precipitation at locations on a surface not intended for such precipitation. This drawback can be avoided by the addition of an oxidation agent, e.g. nitric acid, in trace quantities so as to convert the undesirable iron(II) into iron(III). If the oxidation agent, e.g. nitric acid, is given in excess amounts, which is possible, the drawback occurs that the $Fe^{2+}$ ions produced by exposure to light are immediately converted to $Fe^{3+}$ ions so that no nucleation is possible. Such process is economically unfeasible.

DE-OS [Federal Republic of Germany Laid-Open Application] No. 2,518,520 discloses the use of colloidal solutions of oxyhydrates of palladium, indium, cerium, nickel, manganese, uranium, molybdenum and tungsten as photosensitive sensitizers. One drawback of these colloidal solutions is that the most varied events may cause flocculation of the colloidally dissolved components. The probability of flocculation increases with the number and concentration of foreign substances, e.g. grains of dust.

SUMMARY OF THE INVENTION

It is therefore an object of the present invention to improve processes of this species so that economically feasible chemical metallization not subject to interference becomes possible, particularly for industrial mass production of electronic circuit boards.

The above and other objects are achieved, according to the invention, in a chemical metallization process in which a radiation sensitive sensitizer is applied to an electrically insulating surface to form a radiation sensitive layer on the surface. The sensitizer layer is exposed to radiation to activate at least selected regions of the layer, and a salt solution of a catalytically effective metal is applied to the layer and metal is deposited from the solution in an external current-free manner to form a metal coating at the activated regions of the layer. The sensitizer is oxidation agent-free and contains at least one noble metal salt and at least one chromium(III)

complex compound whose ligands are a reducing agent or, when exposed to light, form a reducing agent for at least chromium(III) ions, thus producing chromium(II) ions. The chromium(II) ions in turn reduce noble metal ions in the noble metal salt to form nuclei which act as centers for current-free metal deposition.

A first advantage of the present invention is that the novel sensitizer is substantially insensitive to oxygen in the air. Therefore, no special protective measures, e.g. the use of a protective gas, are required for the sensitizer bath when used in industrial production. Moreover, the service life of the sensitizer bath is increased considerably.

A second advantage is that the non-noble metal required for nucleation in the unexposed sensitizer is present only with a single oxidation number. Thus, a certain latitude for exposure to light exists for the transfer of patterns in the production of circuit boards. The necessity of having to adapt the exposure conditions to the state of the sensitizer bath, e.g. its age, is eliminated.

A third advantage is that the sensitizer can be used as an aqueous solution and need not be employed in the form of a colloidal solution. This avoids annoying flocculation, e.g. due to impurities in the substrates to be metallized and the service life of the sensitizer bath is extended considerably.

A fourth advantage is that the reducing agent is bound directly to the metal ion to be reduced. This significantly facilitates the redox reaction initiated by the exposure to light. Consequently, the quantum yield is increased and this is equivalent to a greater reaction turnover. The result is that, particularly with spatially selective exposure to light, a short exposure time and/or a low light intensity for the light source are required. This makes possible an economic as well as cost effective exposure process.

A fifth advantage is that it is possible to apply the unexposed sensitizer either over the entire surface area of a substrate and to then expose this surface in a spatially selective manner, e.g. to produce very small electrical conductor paths, or to apply the sensitizer onto the substrate surface in a spatially selective manner, e.g. with the aid of a writing implement or a printing process. In the latter case the substrate surface is then exposed essentially as a whole.

DESCRIPTION OF THE PREFERRED EMBODIMENTS

The present invention is based on the fact that the sensitizer contains a noble metal salt as well as a chromium(III) complex compound in which the ligands, once they are exposed to light of a suitable wavelength, have a reducing effect on chromium having the oxidation number three. The chromium with oxidation number two produced during the exposure then has a direct reducing effect on the noble metal ions contained in the noble metal salt, resulting in the formation of noble metal nuclei which are required for the subsequent metallization without external current. The chromium(III) ion contained in the unexposed sensitizer has an high chemical stability. Thus, chromium(II) in aqueous solutions oxidizes to chromium(III) in the oxygen of the air. Even if air is excluded, oxidation to chromium (III) takes place in that water is reduced by releasing hydrogen. In preferred embodiments the noble metal salt contains at least one metal selected from gold, iridium, osmium, palladium, platinum, rhodium, ruthenium and silver.

Thus, in the unexposed sensitizer, chromium will be present exclusively with the oxidation number +3. The result is an excellent long term stability of such solutions. The absence of chromium of oxidation state +2 in the unexposed sensitizer is particularly important since chromium (II) would lead to undesired nucleation, as described above, and could thus be the cause for undesired metallizing or for the destruction of the metallization baths operating without external current. The unexposed sensitizer, in the preferred embodiments, has a chromium (III) ion/noble metal mole ratio in a range from 10:1 to 1:10.

The activation energy required for the above described redox reactions must be supplied by radiation having wavelengths of less than 400 nm, preferably by UV radiation. Longer-wave radiation is insufficient for activation. It is also undesirable because in it the influence of natural light would make handling difficult. For an absorption maximum at a radiation wavelength between 250 and 260 nm, a preferred embodiment of the invention employs a trioxalate chromate(III)-palladium(II) chloride sensitizer. The stated absorption maximum permits the use of monochromatic coherent UV laser light for illumination. The advantage of laser light is its high energy density and the possible contact free image transfer from the master to the substrate surface without noticeable scattering effects. Moreover, many mercury vapor lamps exhibit emission maxima in this wavelength range.

By combining chromium in oxidation stage III with a noble metal salt, the formation of stable noble metal nuclei directly after exposure to light becomes possible. This formation of metal nuclei can be enhanced by contact with a further solution of noble metal salts. If the light intensity is weak, a maturing process makes enlargement of the nuclei possible. In the subsequently used chemical metallization baths the resulting metallic nucleation layer need then only be reinforced to the intended layer thickness.

The present invention will now be described in greater detail by way of the following examples.

EXAMPLE 1

Circuit board substrate material, e.g. a glass fiber reinforced epoxy resin plate, is cleaned in a known manner and etched. For cleaning, water and organic solvents such as propanol-2 are used; for etching, a commercial chromic acid bath is taken. Sensitization to UV light is effected by immersion into a sensitizer solution prouced in the following manner, particularly in dependence on the substrate material employed and on its pretreatment: 1 to 10 g sodium oxalate and 1 to 18 g chromium(III) chloride are dissolved in 500 ml demineralized water. Added to this is 500 ml of an aqueous solution of 0.1 to 2 g/l palladium(II) chloride, mixed with 1 to 100 ml/l 37% hydrochloric acid and 100 to 800 mg/l wetting agent. When the mixture has taken on a reddish hue, it can be used. Then the coated substrate is dried. The temperature at which the sensitizer solution is applied to the substrate is 25° C. The possible range of temperatures is 1° C. to 50° C. The temperature at which the coated substrate is dried was 50° C. A possible range is 40° C. to 120° C. The required time is always 5 minutes. The wetting agent was sodium-dodecyl-sulfate.

The sensitized substrate material is exposed to UV light from a mercury vapor high pressure lamp through a negative mask containing the conductor pattern to be produced. Here already an image of the conductor pattern can be recognized. This pattern is treated with an aqueous solution containing 0.1 to 0.9 g palladium(II) chloride, 1 to 100 ml 37% hydrochloric acid and 10 to 200 mg of a wetting agent per liter of solution. Then selective chemical metallization is performed in a presently commercially available copper bath which operates without external current until the desired conductor thickness has been obtained.

EXAMPLE 2

Corresponding to Example 1, only that a focused UV laser beam having a wavelength between 250 and 260 nm is used for the exposure. The beam is spatially deflectable and its intensity can be modulated. The associated controls and/or regulation are performed by means of a data processing system in which is stored the conductor pattern (surface pattern) to be produced.

As an alternative to the deflectable laser beam, it is possible to keep the beam stationary and move the base material (substrate) to be exposed, e.g. with the aid of a mechanical stage controlled by the data processing system in accordance with the pattern to be produced.

Thus, in each case, exposure is limited to the surface regions which, are to be provided with conductive material. For radiation exposure the second harmonic generation of the 514.5 nm emission of argon ion gas laser is used. The output intensity was 30 mW. The translation speed of the laser beam was 1 m/min.

EXAMPLE 3

Corresponding to Example 1, except that initially the unexposed sensitizer solution is applied spatially selectively to the circuit board base material (substrate) according to the surface pattern (conductor pattern) to be produced. The thus coated substrate is then exposed essentially over its entire surface area to UV light having a wavelength range from 250 nm to 260 nm and is treated further according to Example 1.

Spatially selective coating can be effected in many ways, for example with the aid of a hand-guided brush and/or an ink writing implement filled with sensitizer solution. Additionally it is possible to fasten a suitably configured writing implement filled with sensitizer solution to the so-called plotter of a data processing system and to coat the substrate in that way according to the pattern to be produced. The light source can then be almost any UV source which radiates over a large area, e.g. a household sun lamp.

Such a process is particularly suitable for the cost-effective production of small series and/or test patterns. An exposure mask suitable for UV light and/or focused UV light are avoided. The exposure time was 1 minute, the light intensity was 0.5 W/cm$^2$.

EXAMPLE 4

The same as Example 1 only that a mixture of sodium trioxalate chromate(III), palladium(II) chloride and polyvinyl alcohol are used for the sensitization. So 1 to 10 g sodium oxalate and 1 to 18 g chromium (III) chloride are mixed with 500 ml polyvinylalcohol. Added to this is 500 ml of a mixture of 0.1 g/l to 2 g/l palladium (II) chloride and polyvinylalcohol.

EXAMPLE 5

The same as Example 1 only that a mixture of potassium trioxalate chromate(III), gold(III) chloride and pentaerythrite is used for the sensitization. So 1 to 10 g potassium oxalate and 1 to 18 g chromium (III) chloride are dissolved in 500 ml demineralized water. Added to this is 500 ml of an aqueous solution of 0.1 to 2 g/l gold (III) chloride, mixed with 1 to 100 ml/l 37% hydrochloric acid and 100 to 10,000 mg/l pentaerythrite.

EXAMPLE 6

The same as Example 1 only that a selective premetallization in a nickel-phosphorus alloying bath takes place before the thick copper plating. The alloying bath consists of a demineralized water solution having the following composition:

15 g/l NiSO$_4$·6 H$_2$O
15 g/l borax
17 g/l citric acid
30 g/l sodium hypophosphite, and is adjusted to a pH of 9 with NaOH. Other noble metal salt-chromium(III)-complex compound mixtures to be suitable for use in the method according to the invention are:

1 to 10 g potassium oxalate, 1 to 18 g chromium (III) chloride and platinum (IV) chloride, dissolved in 500 ml 5% hydrochloric acid; or 1 to 10 g sodium oxalate, 1 to 18 g chromium (III) chloride and rhodium (III) chloride, dissolved in 500 ml 5% hydrochloric acid.

It will be understood that the above description of the present invention is susceptible to various modifications, changes and adaptations, and the same are intended to be comprehended within the meaning and range of equivalents of the appended claims.

What is claimed is:

1. In a chemical metallization process in which a radiation sensitive sensitizer is applied to an electrically insulating surface to form a radiation sensitive layer on the surface, the layer is exposed to radiation to activate at least selected regions of the layer, and a salt solution of a catalytically effective metal is applied to the layer and metal is deposited from the solution in an external current-free manner to form a metal coating at the activated regions of the layer, the improvement wherein the sensitizer is oxidation agent-free and contains at least one noble metal salt and at least one chromium (III) complex compound whose ligands are a reducing agent or, when exposed to light, form a reducing agent for at least chromium(III) ions, to produce chromium-(II) ions which in turn reduce noble metal ions contained in the noble metal salt, thereby forming noble metal nuclei which act as centers for the current-free metal deposition.

2. Chemical metallization process as defined in claim 1 wherein the sensitizer, when unexposed, has a chromium(III) ion/noble metal mole ratio in a range from 10:1 to 1:10.

3. Chemical metallization process as defined in claim 2 wherein the chromium(III) complex compound is a trioxalate chromate(III).

4. Chemical metallization process as defined in claim 1 wherein the noble metal salt contains at least one metal selected from the group consisting of gold, iridium, osmium, palladium, platinum, rhodium, ruthenium and silver.

5. Chemical metallization process as defined in claim 1 wherein the sensitizer is applied essentially over the entire area of the insulating surface and the radiation sensitive layer is then selectively exposed to radiation whose wavelength is less than 400 nm in a pattern according to the surface pattern to be produced.

6. Chemical metallization process as defined in claim 1 wherein the sensitizer is initially applied to the surface in a spatially selective manner according to the surface pattern to be produced, and thereafter the thus coated surface is exposed to radiation having a wavelength less than 400 nm essentially over its entire surface area.

7. Chemical metallization process as defined in claim 1 wherein the radiation employed has a wavelength which essentially lies in a range from 250 nm to 260 nm.

8. Chemical metallization process as defined in claim 1 wherein the layer is exposed to radiation in a selected pattern, and said step of applying a salt solution is carried out by immersing the surface in a metallizing bath containing the solution and operating without external current.

9. Chemical metallization process as defined in claim 1 further comprising treating at least the exposed regions of the layer with a nickel-phosphorus alloying bath after the layer is exposed and before the metallization process is performed.

10. Chemical metallization process as defined in claim 1 wherein the chromium(III) complex compound is a trioxalate chromate(III).

* * * * *